(12) United States Patent
Toyoda

(10) Patent No.: US 7,518,869 B2
(45) Date of Patent: Apr. 14, 2009

(54) INFORMATION PROCESSING APPARATUS WITH A CHASSIS FOR THERMAL EFFICIENCY AND METHOD FOR MAKING THE SAME

(75) Inventor: Shigeru Toyoda, Naka-gun (JP)

(73) Assignee: Ricoh Company, Ltd., Tokyo (JP)

( * ) Notice: Subject to any disclaimer, the term of this patent is extended or adjusted under 35 U.S.C. 154(b) by 241 days.

(21) Appl. No.: 11/405,535

(22) Filed: Apr. 18, 2006

(65) Prior Publication Data

US 2006/0285293 A1 Dec. 21, 2006

(30) Foreign Application Priority Data

Apr. 18, 2005 (JP) ............... 2005-120374

(51) Int. Cl.
*H05K 7/20* (2006.01)
*F28F 7/00* (2006.01)
*H05K 5/00* (2006.01)

(52) U.S. Cl. ............ 361/700; 361/697; 361/695; 415/206; 165/185; 165/104.33; 454/184

(58) Field of Classification Search ......... 361/687, 361/695, 697, 700; 415/206; 174/16.3; 165/185; 257/717–719; 312/236; 454/184
See application file for complete search history.

(56) References Cited

U.S. PATENT DOCUMENTS

| 5,297,005 | A | * | 3/1994 | Gourdine | 361/697 |
| 5,432,674 | A | * | 7/1995 | Hardt | 361/694 |
| 5,917,698 | A | * | 6/1999 | Viallet | 361/695 |
| 6,058,009 | A | * | 5/2000 | Hood et al. | 361/687 |
| 6,094,345 | A | * | 7/2000 | Diemunsch | 361/695 |
| 6,352,103 | B1 | * | 3/2002 | Chu et al. | 165/80.3 |
| 6,400,567 | B1 | * | 6/2002 | McKeen et al. | 361/695 |
| 6,462,948 | B1 | * | 10/2002 | Leija et al. | 361/697 |
| 6,721,180 | B2 | * | 4/2004 | Le et al. | 361/695 |
| 7,061,761 | B2 | * | 6/2006 | Tucker et al. | 361/695 |
| 7,289,323 | B2 | * | 10/2007 | Chang et al. | 361/695 |
| 2002/0053421 | A1 | * | 5/2002 | Hisano et al. | 165/104.33 |
| 2003/0016496 | A1 | * | 1/2003 | Kim et al. | 361/695 |
| 2004/0095723 | A1 | * | 5/2004 | Tsai et al. | 361/695 |
| 2005/0174732 | A1 | * | 8/2005 | Lin | 361/695 |
| 2005/0195568 | A1 | * | 9/2005 | Shyr | 361/695 |

FOREIGN PATENT DOCUMENTS

| JP | 05-004497 | 1/1993 |
| JP | 05-066096 | 3/1993 |
| JP | 11-340669 | 12/1999 |
| JP | 2002-271073 | 9/2002 |
| JP | 2003-108269 | 4/2003 |

* cited by examiner

*Primary Examiner*—Jayprakash N Gandhi
*Assistant Examiner*—Zachary M Pape
(74) *Attorney, Agent, or Firm*—Oblon, Spivak, McClelland, Maier & Neustadt, P.C.

(57) ABSTRACT

An information processing unit and a method for making the same with a cooling structure for a heat generating element, for example a CPU, which can efficiently cool the CPU without losing flexibility of a board level packaging. The information processing apparatus includes a cooling unit cooling the heat generating element, an airflow supply unit supplying airflow to a part of the cooling unit, an airflow control unit controlling airflow applied to the airflow supply unit, an inlet, and an outlet. The airflow supply unit, the airflow control unit, and the part of the cooling unit are linearly arranged. The inlet is located to draw air towards the airflow control unit and the exhaust is located to exhaust air from the part of the cooling unit.

15 Claims, 4 Drawing Sheets

INFORMATION PROCESSING APPARATUS WITH A CHASSIS FOR THERMAL EFFICIENCY AND METHOD FOR MAKING THE SAME

BACKGROUND OF THE INVENTION

1. Field of the Invention

The present invention is directed to an information processing apparatus that provides a chassis with improved mechanical and thermal design efficiencies so that heat generating elements are better cooled.

2. Discussion of the Background

Because of the increased desire for CPU performance in an information processing apparatus, resulting from increased use of the Internet, more complicated processing applications, etc., the CPU is becoming more and more required to perform high load processes, for example image processing or time-varying image processing. Although CPU performance is increasing, such increased CPU performance typically also results in the CPU generating more heat. If the increased heat generated by a CPU is not efficiently dissipated the CPU performance can deteriorate.

As one resolution for the above problem, JP 2003-108269 discloses a main frame separated into two parts, a high temperature region and a low temperature region, by a region separation unit including a riser board and a riser bracket. In that device the internal electric devices are cooled by utilizing a CPU cooling fan, an additional fan for the high temperature regions, and by applying a power supply unit cooling fan for the low temperature region.

SUMMARY OF THE INVENTION

However, the present inventors recognized the solution in the above-noted art has drawbacks. Specifically, with such a solution the layout for implementing electric devices to a SMT (surface mount technology) substrate is restricted. In fact in such a device flexibility of a board level packaging is adversely affected. Further, in such a device it is unclear how the air dispersed by the cooling fan is ejected.

Accordingly, one object of the present is to provide a novel information processing unit with a novel cooling structure for a heat generating element, for example a CPU, which can efficiently cool the CPU without losing flexibility of a board level packaging.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
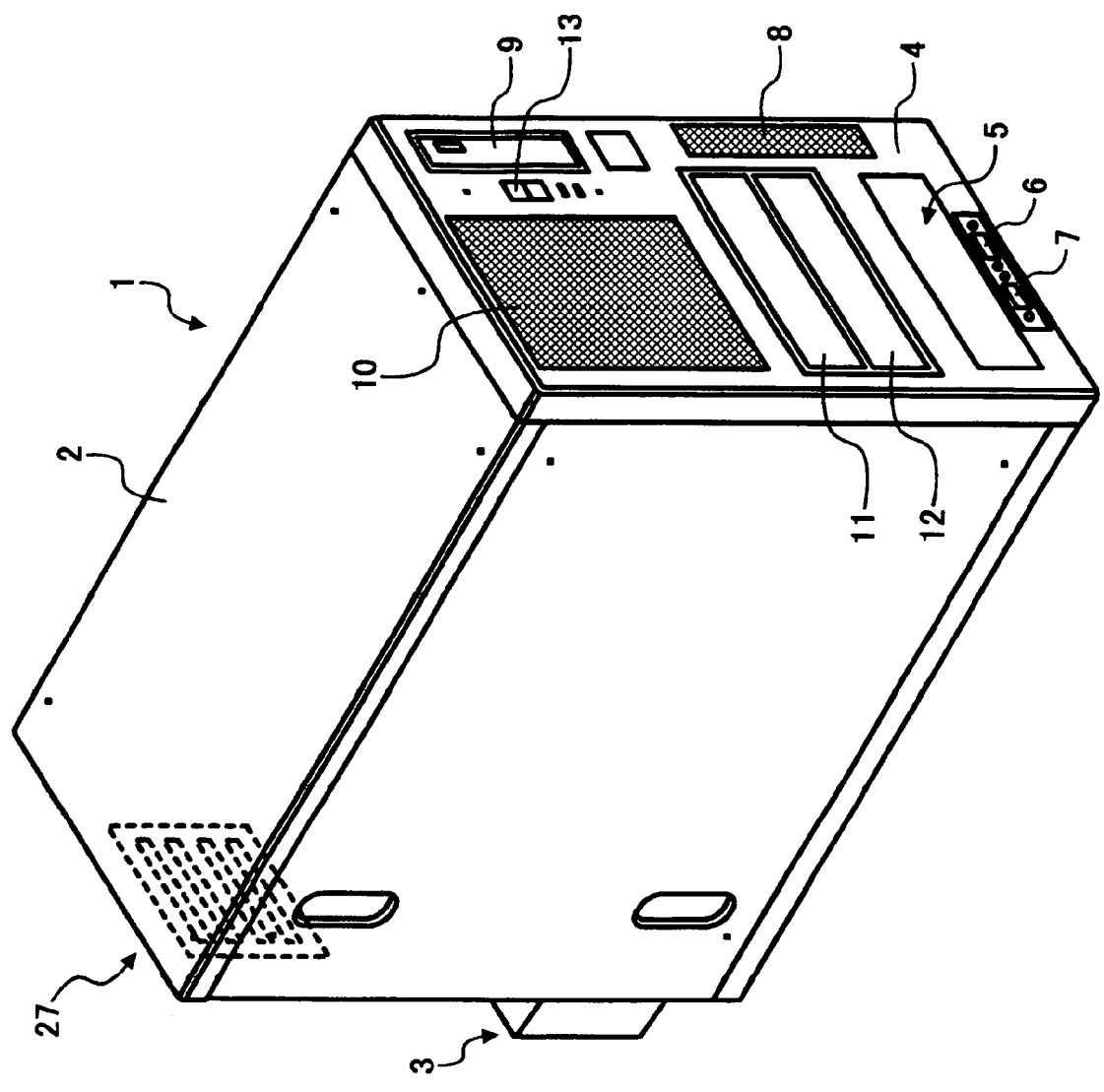
FIG. 1 shows an external view of an embodiment of an information processing apparatus in accordance with the present invention.
Figure 2:
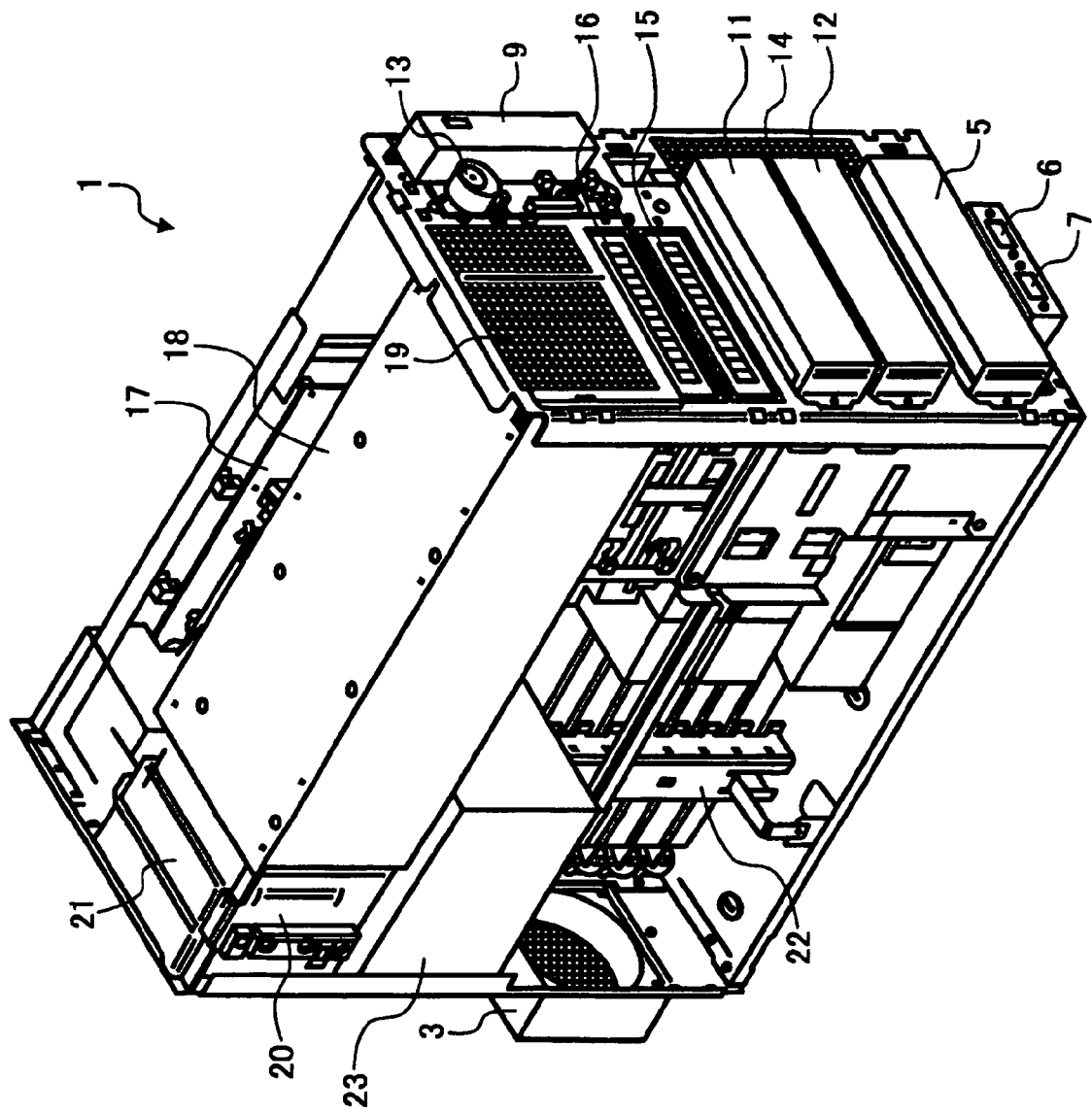
FIG. 2 shows an internal view of the information processing apparatus in the embodiment of the present invention.

Referring now to the drawings, wherein like reference numerals designate identical or corresponding parts throughout the several views, FIG. 1 shows an external view of an information processing apparatus 1 of the present invention, and FIG. 2 shows an internal view of that information processing apparatus 1.

As shown in FIG. 1 the information processing apparatus 1 includes a cover 2 that covers the upper portion and both sides of the apparatus, which forms a part of a chassis, and a fan attachment member 3, which houses a fan used to cool the inside of the chassis. A front cover 4 includes a first inlet member 10 and a second inlet member 8. Both inlet members 10 and 8 include a number of intake ducts respectively. Further, each of these inlet members 10 and 8 also include at the rear surfaces filters for preventing foreign matter from entering into the information processing apparatus 1.

The information processing apparatus 1 also includes a removable battery unit 5, for example which can house a 5-inch removable battery, universal serial bus (USB) terminals 6, 7, a floppy-disk drive 9, optical disk drives 11 and 12, for example 5-inch optical disk drives, and a power switch 13.

FIG. 2 shows the information processing apparatus 1 without the upper and side cover 2 and without the front cover 4, to thereby show the inside of the chassis.

As shown in FIG. 2 the information processing apparatus 1 includes hard disk drives 15 and 16, for example 3.5-inch hard disk drives. A mother board 17 loaded with devices such as a CPU or memory is located along the side of the chassis. A general power supply unit 23, for example tailored to an ATX specification written by Intel is also provided. The power supply unit 23 typically includes its own fan (not shown).

Furthermore, the information processing apparatus 1 includes a holding member 22 to hold expansion cards inserted to extended slots of the mother board 17. The fan housing 3 is provided to hold a fan (not shown), which for example can be model No. D08A manufactured by Nihon Densan.

In one operation of the device shown in FIGS. 1 and 2, air is drawn in from the second input member 8 and flows through a screen 14 position behind the second input member 8 into the internal space of the information processing apparatus 1. The air is exhausted from the fan mounted in the fan attachment member 3 and the fan included in the power supply unit 23 after being warmed by the internal electric devices. With such an operation it becomes possible to exhaust heat generated from the various devices such as the floppy disk drive 9, optical disk drives 11 and 12, hard disk drives 15 and 16, battery unit 5, electronic devices loaded on the mother board 17, and the power supply unit 23. In addition the fan housed in the fan housing 3 and the fan included in the power supply unit 23 can exhaust part of the heat generated from a CPU on the mother board 17.

One feature in the claimed invention is to provide another cooling mechanism dedicated to cooling a CPU on the mother board 17. To realize that objective, the image processing apparatus 1 additionally includes a duct 18 as an airflow control device to control an airflow to another cooling mechanism. Air passes through the duct 18 after being drawn in through the first inlet member 10 and passing through a screen 19 directly behind the first inlet member 10. Further, a CPU cooling fan 20 provides airflow to a CPU cooling unit. A part of the CPU cooling unit is held by the CPU cooling unit attachment device 21.

The air duct 18 is a hollow duct structured from metal plates. The size of the cooling fan 20 may be, as a non-limiting example, 92 mm$^2$ and for example can be product No. 9A0912F02 manufactured by Sanyo Denki. CPU cooling unit attachment device 21 is located on or near the back surface of the chassis of the information processing unit 1. An output exhaust unit 27 (shown in FIG. 1) is provided to exhaust air that has passed through the duct 18 and through the CPU cooling unit attachment device 21, and is located on the back surface of the chassis in correspondence to the position of the CPU cooling unit attachment device 21.

Figure 3:
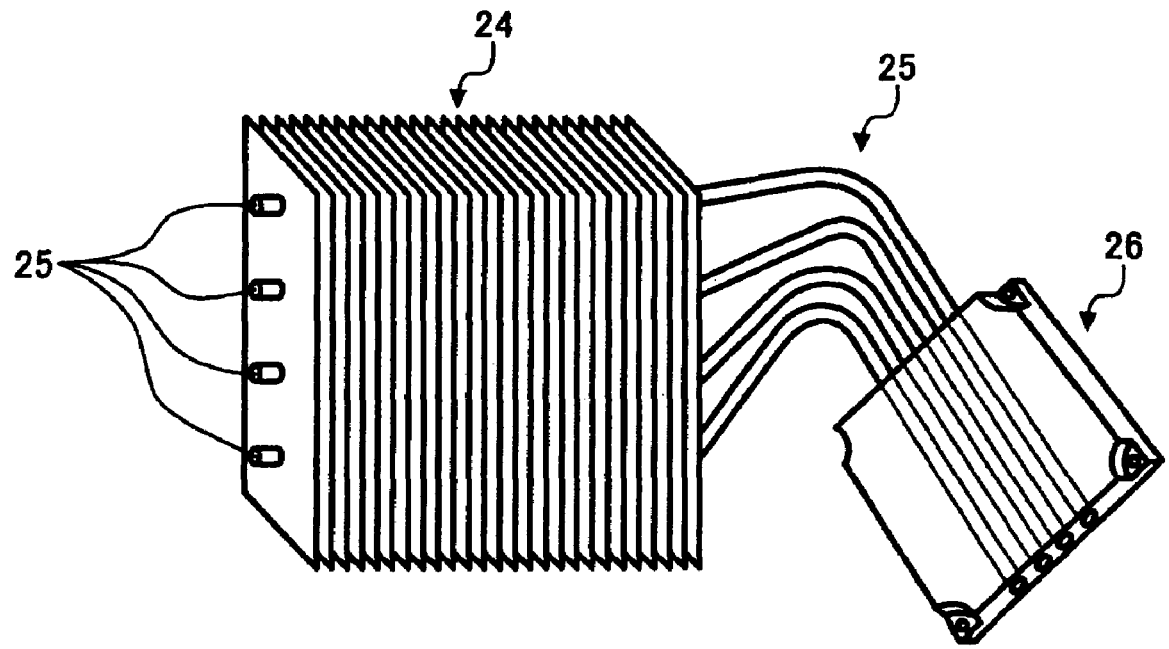
FIG. 3 shows an external view of a CPU cooling unit in the embodiment of the information processing apparatus of the present invention.

FIG. 3 shows specifics of the CPU cooling unit, a part of which is held or supported in the CPU cooling unit attachment device 21. The CPU cooling unit as shown in FIG. 3 includes a fin unit 24, i.e., a radiator unit, made from aluminum, for example made of 47 aluminum plates each with a size of 95 mm ×50 mm and each with a thickness of 0.3 mm. The fin unit 24 is cooled by the CPU cooling fan 20. Four heat pipes 25 made from copper can contain water or another cooling liquid. The heat pipes 25 penetrate into a heat receiving unit 26 and into the fin unit 24. The heat receiving unit 26 is positioned close against or in contact with the CPU to receive heat from the CPU. The heat received by the heat receiving unit 26 warms the cooling liquid in the heat pipes 25, and dries off the cooling liquid inside the heat pipes 25. The water vapor generated inside the heat pipes 25 is cooled by the fin unit 24 and then returns back to the heat receiving unit 26. With such an operation heat picked up by the heat receiving unit 26 (from the CPU) and transferred to the heat pipes 25 is cooled in the fin unit 24. Thereby, heat generated in the CPU can be dissipated and the CPU can be cooled.

Figure 4:
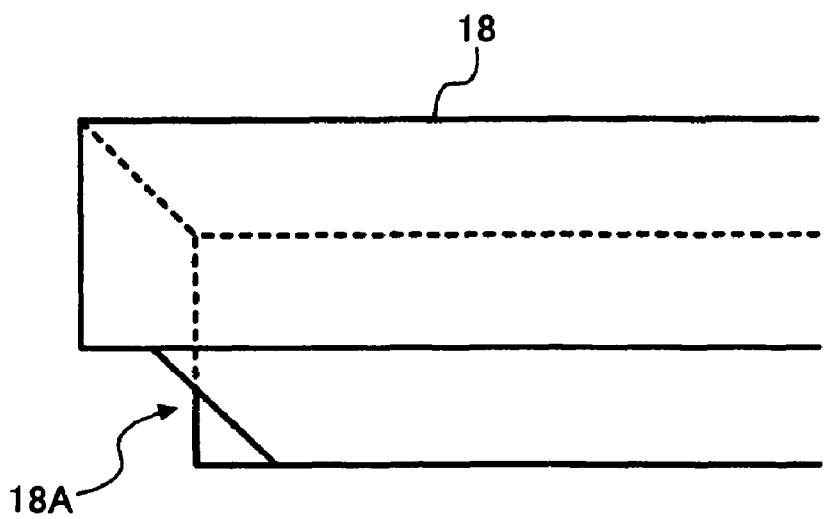
FIG. 4 shows an external view of a cutout part of an air duct in the embodiment of the information processing apparatus of the present invention.

FIG. 4 shows an end of the air duct 18. The air duct 18 can include a cutout part 18A at its bottom, and thereby mounting the air duct 18 to the information processing unit 1 can be made easier because of the location of the cutout part 18A. In manufacturing the information processing apparatus 1, initially the CPU cooling fan 20 and the CPU cooling unit attachment device 21 can be positioned inside the information processing apparatus 1. Then, the bottom edge of air duct 18 which will be adjacent the first screen 19 acts as a fulcrum shaft at a predetermined position, and the opposite edge of the air duct 18 is then lowered into position next to the CPU cooling unit attachment device 21. Thereby, the air duct 18 can be properly located without catching on the CPU cooling fan 20 or the CPU cooling unit attachment device 21.

Figure 5:
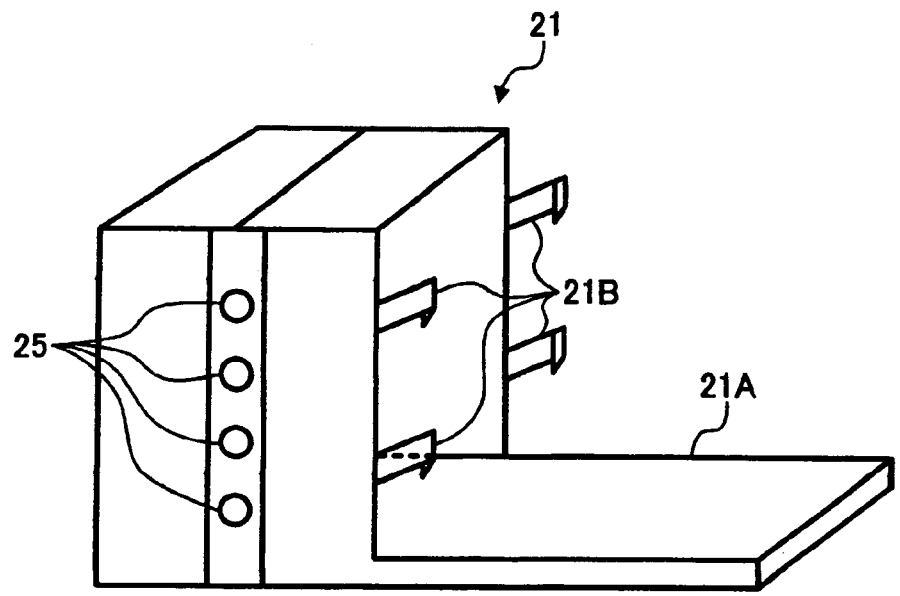
FIG. 5 shows an external view of a CPU cooling unit holding part in the embodiment of the information processing apparatus of the present invention.

FIG. 5 shows an external view of the CPU cooling unit attachment device 21. The heat fin unit 24 is located inside the cooling unit attachment device 21, via the talons 21B. The CPU cooling unit attachment device 21 can be made from an ABS resin, and is formed as a hollow element including the fin unit 24. The CPU cooling fan 20 is attached to the CPU cooling unit attachment device 21 by attaching the CPU cooling fan 20 to the talons 21B. The CPU cooling unit attachment device 21 also includes a receiving extension part 21A. That extension part 21A serves as a cover to prevent warm air, which travels over the cutout part 18A of the air duct 18, from traveling to other paths inside the information processing apparatus 1, and similarly prevents air from other paths inside the information processing apparatus 1 from entering the CPU cooling unit attachment device 21. Thereby, air passing through the air duct 18 will all pass to the CPU cooling fan 20.

In view of the above-noted structure, air drawn into the first inlet member 10 passes through the screen 19 and into the air duct 18, thereby enters the CPU cooling fan 20 and then passes through the CPU cooling unit attachment device 21, and thereby passes through the fin unit 24 inside the CPU cooling unit attachment device 21. The fin unit 24, which has drawn heat from the CPU, will then be cooled by the air, and the air is then output through the output port 27.

The above-noted structure includes a linear arrangement of the air duct 18, the CPU cooling fan 20, and the CPU cooling unit attachment device 21. Thereby, air traveling through the air duct 18 can move smoothly without any significant air resistance barrier, which can enhance cooling of the CPU.

The information processing apparatus 1 can be manufactured in the following way. A chassis including at least the screen 14 and screen 19 is prepared. Basic devices are then attached to the chassis, for example the mother board 17 including the CPU, the power supply unit 23, the power supply switch 13, USB connectors 6 and 7, and the fan is loaded into the fan attachment member 3. Then, the removable battery unit 5, the floppy-disk drive 9, the optical disk drives 11 and 12, and the hard disk drives 15 and 16 are loaded onto the chassis. The CPU cooling unit including the fin unit 24, the heat pipe unit 25, and the heat receiving unit 26, and the CPU cooling fan 20 are then loaded into the CPU cooling unit attachment device 21. The CPU cooling unit attachment device 21 is then attached to the chassis. Finally, the cover 2 is provided on the chassis.

FIG. 6 shows alternative shapes that can be utilized for the air duct 18.

Figure 6A:
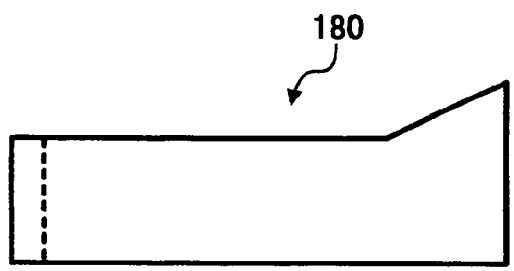
FIGS. 6A and 6B show modifications of an air duct that can be utilized in the information processing apparatus of the present invention.
Figure 6B:
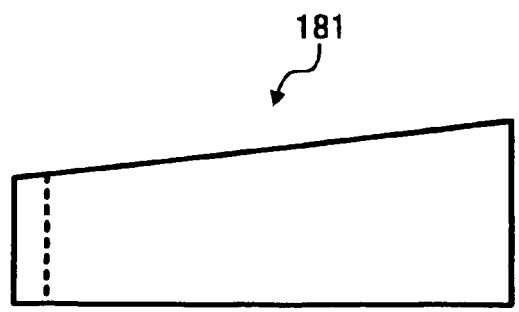

FIG. 6A shows a first alternative air duct 180 that includes an enlarged inlet, but which is formed so as to be straight through in the middle. FIG. 6B includes an alternative air duct 181 that includes an enlarged inlet, but which is formed so as to gradually narrow. In both of these ducts the amount of input air drawn into the air ducts 180 and 181 can be increased, and thereby cooling efficiency may be able to be improved.

Certain overall effects realized by the image information processing apparatus 1 of the present invention are as follows. Air drawn into the second inlet member 8 can be used to mainly exhaust heat generated from the floppy disk drive 9, optical disk drives 11 and 12, hard disk drives 15 and 16, the battery unit 5, electronics loaded on the mother board 17, and the power supply unit 23 (although that element may also include its own fan). Further, air drawn into the first inlet member 10 can be dedicated to cooling only the CPU.

With such a structure, electronic devices that generate less heat value can be cooled by the fan located inside the fan attachment unit 3 and the fan in the power supply unit 23. At the same time a CPU that generates more heat can be more intensively cooled by a dedicated system.

In addition, as the CPU cooling unit formed of fin unit 24, heat pipe unit 25, and heat receiving unit 26 is constructed as a separate unit from the mother board 17, a relatively free implementation of electronic devices loaded onto the mother board 17 can be realized in correlation with the CPU. Such a structure has fewer restrictions on a board level packaging.

With such a structure it is also acceptable for the fin unit 24 to be located above a level of a CPU because a liquid, for example water, is restored to the heat receiving unit 26 when a cooled liquid vapor changes to liquid and can then be transported through the inside of the heat pipes 25. As a result the air duct 18, the CPU cooling fan 20, and the CPU cooling unit attachment device 21 can be located in an upper region of the information processing unit 1. Such a layout can also make locating those elements above a level of the CPU easier, and thereby provide a more effective cooling of the CPU. The air duct 18, the CPU cooling unit 20, and the CPU cooling unit attachment device 21 may also, however, be located at a lower region of the information processing apparatus 1 if the CPU is located at a lower portion of the information processing apparatus 1, although those elements are preferably still positioned above the CPU.

As noted above air passing through the air duct 18 is used for cooling the CPU. However, that air can be diverted for other uses for other devices that generate a relatively higher heat, for example a chip set. In that case, the heat receiving unit 26 may be formed of different portions that are located adjacent to each of the higher heat generating devices. Alternatively the heat receiving unit 26 may be set up so as to contact the CPU and such other heat generating devices as still a single unit. In fact the heat receiving unit 26 may be provided to cool only the other heat generating devices if the CPU is an element that does not generate significant heat.

In view of the structure noted above air is drawn in from the front surface of the image processing apparatus 1 and exhausted out its back surface. However alternative structures are available; for example air may be drawn in from a first side surface and exhausted out of another side surface of the image processing apparatus 1. One benefit realized in the claimed invention is the linearity of the cooling unit to avoid any blockage of airflow into and ensure a smooth airflow, and such a structure could still be implemented if air is drawn in from a side surface and exhausted out of another side surface.

As noted above the air duct 18 may be formed of an aluminum or a metal plate. However, the air duct 18 can be formed of alternative materials, for example an ABS resin, if desired. In addition the air duct 18 can take different shapes than the shown rectangular shapes, for example can be a cylindrical shape. The air duct should preferably be able to control airflow so that it moves smoothly from input to output.

Also of course the size of the CPU cooling fan 20 is not limited but for example could be 92 $mm^2$ and could in fact take on a size that can cool the entire image processing apparatus.

The floppy disk drive 9, removable battery 5, optical disk drives 11 and 12, and hard disk drives 15 and 16 are all optional devices and all and some of them could be removed.

Obviously, numerous additional modifications and variations of the present invention are possible in view of the above teachings. It is therefore to be understood that the present invention is not limited by the presently disclosed embodiments, but many modifications are readily recognizable to one of ordinary skill in the art.

The present application is based on and claims priority to Japanese Patent Application No. 2005-120374 filed on Apr. 18, 2005, the entire contents of which are hereby incorporated herein by reference.

The invention claimed is:

1. An information processing apparatus including a heat generating element generating heat, the information processing apparatus comprising:
   a cooling unit configured to cool the heat generating element;
   an airflow supply duct configured to supply airflow to a part of the cooling unit;
   an airflow control fan configured to control airflow applied to the airflow supply duct, wherein the airflow supply duct, the airflow control fan, and the part of the cooling unit are linearly arranged; and
   a first inlet and a first exhaust, wherein the first inlet is located so as to draw air toward the airflow control fan, and wherein the first exhaust is located so as to exhaust air from the part of the cooling unit,
   wherein the airflow supply unit includes a cutout portion configured such that a bottom of the airflow control unit does not contact the airflow supply unit or the cooling unit when the airflow control unit is installed.

2. The information processing apparatus of claim 1, further comprising:
   a cooling unit attachment device configured to attach the part of the cooling unit;
   wherein the cooling unit attachment device includes a receiving part configured to cover the cutout portion.

3. The information processing apparatus of claim 1, wherein the airflow supply duct is configured such that an input air side is wider than an output air side.

4. The information processing apparatus of claim 1, wherein the cooling unit includes:
   a heat receiving unit configured to receive heat from the heat generating element; and
   a heat conducting unit;
   wherein the heat conducting unit is configured such that heat from the heat receiving unit of the cooling unit is conducted through the heat conducting unit to the part of the cooling unit.

5. The information processing apparatus of claim 4, wherein the part of the cooling unit includes a fin unit including a plurality of aluminum plates.

6. The information processing apparatus of claim 1, wherein the cooling unit includes:
   a heat receiving unit configured to receive heat from the heat generating element; and
   a heat conducting unit;
   wherein the heat conducting unit includes at least one heat pipe including a liquid inside; and
   wherein the at least one heat pipe is configured to penetrate the part of the cooling unit and the heat receiving unit.

7. The information processing apparatus of claim 6, wherein the part of the cooling unit is located above a level of the heat generating element.

8. An information processing apparatus including a heat generating element generating heat, the information processing apparatus comprising:
   means for cooling the heat generating element;
   means for supplying airflow to a part of the means for cooling;
   means for controlling airflow applied to the part of the means for cooling, wherein the means for supplying airflows, the means for controlling airflow, and the part of the means for cooling are linearly arranged;
   first inlet means for taking in air and first exhaust means for exhausting air, wherein the first inlet means is located so as to draw air toward the means for controlling airflow, and wherein the first exhaust means for exhausting air is located so as to exhaust air from the part of the means for cooling,
   wherein the means for supplying airflow includes:
   a cutout part configured such that a bottom of the means for controlling airflow does not contact the means for supplying airflow or the means for cooling when the means for controlling airflow is installed.

9. The information processing apparatus of claim 8, further comprising:
   cooling means attachment means for attaching the part of the means for cooling;
   wherein the cooling means attachment means includes a receiving part for covering the cutout part.

10. The information processing apparatus of claim 8, wherein the means for supplying airflow is configured such that an air input side is wider than an air output side.

11. The information processing apparatus of claim 8, wherein the means for cooling includes:
   means for receiving heat from the heat generating element; and
   means for conducting heat;
   wherein the means for conducting heat is configured such that heat from the means for receiving heat is conducted through the means for conducting heat to the part of the means for cooling.

12. The information processing apparatus of claim 8, wherein the means for cooling includes:
   means for receiving heat from the heat generating element; and
   means for conducting heat;
   wherein the means for conducting heat includes at least one heat pipe including a liquid inside;
   wherein the heat pipe is configured to penetrate the part of the means for cooling and the means for receiving heat.

13. The information processing apparatus of claim 12, wherein the part of the means for cooling heat is located above a level of the heat generating element.

14. The information processing apparatus of claim 13, wherein the part of the means for cooling includes a plurality of aluminum plates.

15. A method for manufacturing an information processing apparatus with a chassis, the method comprising:
   locating a heat generating unit on the chassis;
   locating a part of a cooling unit for cooling the heat generating unit and an airflow supplying duct for supplying air to the part of cooling unit on a cooling unit fixing part having a receiving part;
   contacting a second part of the cooling unit with the heat generating unit;
   locating an airflow controlling fan including a cutout part at one side next to the cooling unit fixing part on the chassis by lowering a first side of the airflow controlling fan onto a position next to the cooling unit fixing part using a bottom edge of another side of the airflow controlling unit as a fulcrum shaft; and
   covering the cutout part with the receiving part.

* * * * *